(12) United States Patent
Yun et al.

(10) Patent No.: US 10,899,886 B2
(45) Date of Patent: Jan. 26, 2021

(54) POLYIMIDE PRECURSOR SOLUTION AND METHOD FOR PRODUCING SAME

(71) Applicant: LG CHEM, LTD., Seoul (KR)

(72) Inventors: Cheolmin Yun, Daejeon (KR); Bora Shin, Daejeon (KR); Kyungjun Kim, Daejeon (KR); Jun Sik Suh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 135 days.

(21) Appl. No.: 16/078,725

(22) PCT Filed: Aug. 11, 2017

(86) PCT No.: PCT/KR2017/008769
§ 371 (c)(1),
(2) Date: Aug. 22, 2018

(87) PCT Pub. No.: WO2018/056573
PCT Pub. Date: Mar. 29, 2018

(65) Prior Publication Data
US 2019/0048141 A1  Feb. 14, 2019

(30) Foreign Application Priority Data
Sep. 23, 2016 (KR) .................. 10-2016-0121936

(51) Int. Cl.
*C08G 73/10* (2006.01)
*H01L 27/12* (2006.01)
*C08J 5/18* (2006.01)

(52) U.S. Cl.
CPC ....... *C08G 73/1014* (2013.01); *C08G 73/106* (2013.01); *C08G 73/1032* (2013.01); *C08G 73/1039* (2013.01); *C08G 73/1042* (2013.01); *C08G 73/1067* (2013.01); *C08J 5/18* (2013.01); *H01L 27/1218* (2013.01); *C08G 73/1064* (2013.01); *C08J 2379/08* (2013.01)

(58) Field of Classification Search
CPC ............ C08G 73/1032; C08G 73/1075; C08G 73/1042; C08L 79/08
See application file for complete search history.

(56) References Cited

U.S. PATENT DOCUMENTS

| | | | |
|---|---|---|---|
| 5,939,498 A * | 8/1999 | Sutton, Jr. ............... | C08L 79/08 264/211.12 |
| 9,416,229 B2 | 8/2016 | Chen et al. | |
| 9,828,469 B2 | 11/2017 | Wakita et al. | |
| 9,902,810 B2 | 2/2018 | Urakami et al. | |
| 2009/0088551 A1 | 4/2009 | Yamashita | |
| 2010/0086792 A1 | 4/2010 | Chiang et al. | |
| 2013/0211040 A1 | 8/2013 | Nakao et al. | |
| 2014/0011089 A1* | 1/2014 | Yamada ................. | C08G 73/16 429/211 |
| 2014/0031499 A1 | 1/2014 | Cho et al. | |
| 2014/0329941 A1 | 11/2014 | Chang | |
| 2015/0147554 A1 | 5/2015 | Chae et al. | |
| 2016/0032055 A1 | 2/2016 | Urakami et al. | |
| 2016/0222165 A1 | 8/2016 | Wakita et al. | |
| 2016/0251545 A1 | 9/2016 | Yun et al. | |
| 2017/0096530 A1 | 4/2017 | Yun et al. | |
| 2019/0062590 A1 | 2/2019 | Yun et al. | |

FOREIGN PATENT DOCUMENTS

| | | |
|---|---|---|
| CN | 105218813 A | 1/2016 |
| CN | 105301902 A | 2/2016 |
| CN | 105637016 A | 6/2016 |
| EP | 2690124 A2 | 1/2014 |
| EP | 3150655 A1 | 4/2017 |
| JP | 2005-306983 A | 11/2005 |
| JP | WO 2014098235 * | 6/2014 |
| JP | 2016-531997 A | 10/2016 |
| JP | 2017-524040 A | 8/2017 |
| KR | 10-2015-0086496 A | 7/2015 |
| KR | 10-2016-0037489 A | 4/2016 |
| TW | 201014878 A | 4/2010 |
| TW | 201217435 A | 5/2012 |
| TW | 201434973 A | 9/2014 |
| TW | 201443530 A | 11/2014 |
| TW | 201605977 A | 2/2016 |
| WO | 2013-154141 A1 | 10/2013 |
| WO | 2014-098235 A1 | 6/2014 |

(Continued)

OTHER PUBLICATIONS

Search Report and Written Opinion issued for PCT Application No. PCT/KR2017/008769 dated Nov. 27, 2017, 9 pages.
Office Action issued for Korean Patent Application No. 1020160121936 dated Feb. 22, 2017, 7 pages.
Office Action issued for Taiwanese Patent Application No. 106128095 dated May 21, 2018, 8 pages.
Search Report issued for European Patent Application No. 17 853 287.5 dated Aug. 30, 2019, 9 pages.

*Primary Examiner* — Gregory Listvoyb

(74) *Attorney, Agent, or Firm* — Rothwell, Figg, Ernst & Manbeck, P.C.

(57) ABSTRACT

The present invention provides a polyimide film which, by having a fluorine structure adopted into a rigid polyamide chain structure, exhibits not only superb heat resistance but also enhanced optical properties. Additionally, the polyimide according to the present invention, by having the particular structure, exhibits excellent transparency, heat-resistance, mechanical strength and flexibility, and thus can be utilized in a variety of functions such as an element substrate, display cover substrate, optical film, integrated circuit (IC) package, adhesive film, multi-layered flexible printed circuit (FPC), tape, touch panel, and protective film for optical disks.

6 Claims, No Drawings

(56) References Cited

FOREIGN PATENT DOCUMENTS

| WO | 2014-162734 A1 | 10/2014 |
|---|---|---|
| WO | 2015-046019 A1 | 4/2015 |
| WO | 2015-183056 A1 | 12/2015 |
| WO | 2016-088641 A1 | 6/2016 |
| WO | 2016-140559 A1 | 9/2016 |

* cited by examiner

POLYIMIDE PRECURSOR SOLUTION AND METHOD FOR PRODUCING SAME

CROSS-REFERENCE TO RELATED APPLICATION(S)

The application is a 35 U.S.C. § 371 National Phase Entry Application from PCT/KR2017/008769, filed on Aug. 11, 2017, and designating the United States, which claims the benefit of priority to Korean Patent Application No. 10-2016-0121936, filed on Sep. 23, 2016, which are incorporated herein by reference in their entirety for all purpose.

TECHNICAL FIELD

The present invention provides a polyimide precursor solution for manufacturing a polyimide film with enhanced heat resistance and optical properties.

BACKGROUND ART

Polyimide (PI) is a polymer having relatively low crystallinity or substantially amorphous structure, and it has advantages such as easy manufacturing process, easy process to make a thin film and no crosslinkable moieties necessary for curing, as well as polymeric properties such as high transparency, excellent thermal and chemical resistance, excellent mechanical and electrical properties, and dimensional stability due to its rigid chain structure. The polyimide is now widely used as an electrical and electronical material for the field of car and aerospace, a flexible circuit board, a liquid crystal alignment film for LCD, an adhesive as well as a coating agent.

Even though the polyimide is a high performance polymer with excellent thermal stability, mechanical properties, chemical resistance and electrical properties, it does not satisfy the basic requirements for the display area such as colorless transparency, and the thermal expansion coefficient should be further lowered. For example, KAPTON sold by Dupont has a low thermal coefficient of about 30 ppm/° C., but it also does not meet the requirement for the plastic substrate. Therefore, now studies for minimizing change in thermal history and optical properties while maintaining the basic properties of the polyimide are underway.

In general, aromatic polyimide has unique color of dark brown. The reason for this is that electrons can be excited due to a electrons, π electrons, nonbonding unshared electron pairs within the imide structure, and it can be explained by the theory of charge transfer complex (hereinafter, called CT-complex) induced by π electrons of benzene within a main chain of the polyimide.

In general, the polyimide absorbs light of the wavelength below 400 nm to 500 nm of visible light region, and therefore it shows complementary color of yellow to red. In order to lower the CT-complex that is an disadvantage of the polyimide, a method of introducing an electron-withdrawing functional group having relatively strong electronegativity such as trifluoromethyl ($-CF_3$), sulfone ($-SO_2-$) and ether ($-O-$) to the main chain of the polyimide is used to lower resonance effect by limiting the movement of π electron. Also introducing a cyclo-olefin structure instead of benzene to the main chain of the polyimide can reduce π electron density to manufacture a colorless transparent polyimide film.

Meanwhile, polyamide-imide has been widely used as an industrial material in the electrical, mechanical, electronic and aerospace fields due to its excellent properties such as thermal resistance, mechanical strength and electrical property. Also, in general, structure of the polyamide-imide is different from that of the polyimide and is known to be soluble in an organic solvent, allowing for the application for an enamel varnish, a coating agent for electrical insulation and paint, which need solution casting.

However, for the application in the display area, it is still necessary to develop a polymer for the flexible display with lower thermal expansion coefficient, high solubility, transparency as well as thermal stability.

DISCLOSURE

Technical Problem

An object of the present invention is to provide a polyimide precursor solution for manufacturing a polyimide film with enhanced heat resistance and optical properties.

Another object of the present invention is to provide a polyimide film manufactured from the polyimide precursor solution.

Further another object of the present invention is to provide a method for manufacturing the polyimide film by using the polyimide precursor solution.

Technical Solution

In order to solve the above-mentioned technical problems, the present invention provides a polyimide precursor solution which comprises a polyimide precursor manufactured by reacting polymerization ingredients, which comprises:

tetracarboxylic dianhydrides of Chemical Formula 1 and Chemical Formula 2; and
a diamine of Chemical Formula 3,
in an organic solvent:

[Chemical Formula 1]

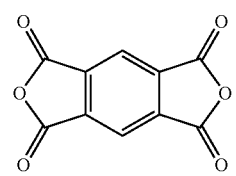

[Chemical Formula 2]

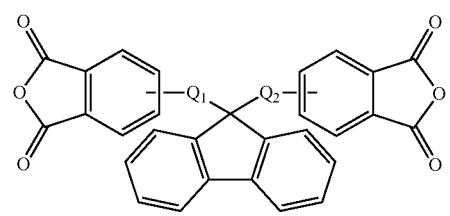

wherein,
$Q_1$ and $Q_2$ are each independently selected from the group consisting of a single bond, $-O-$, $-C(=O)-$, $-C(=O)O-$, $-C(=O)NH-$, $-S-$, $-SO_2-$, a phenylene group and a combination thereof;

[Chemical Formula 3]

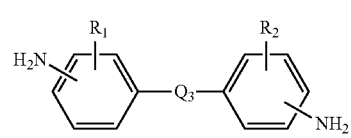

wherein, $R_1$ and $R_2$ are each independently a substituent selected from a halogen atom selected from the group consisting of —F, —Cl, —Br and —I, a hydroxyl group (—OH), a thiol group (—SH), a nitro group (—NO$_2$), a cyano group, a $C_{1-10}$ alkyl group, a $C_{1-4}$ halogenoalkoxyl group, a $C_{1-10}$ halogenoalkyl group, and a $C_{6-20}$ aryl group; and $Q_3$ is selected from the group consisting of a single bond, —O—, —CR$_{18}$R$_{19}$—, —C(=O)—, —C(=O)O—, —C(=O)NH—, —S—, —SO$_2$—, a phenylene group and a combination thereof, wherein $R_{18}$ and $R_{19}$ are each independently selected from the group consisting of a hydrogen atom, a $C_{1-10}$ alkyl group and a $C_{1-10}$ fluoroalkyl group.

According to one embodiment, the tetracarboxylic dianhydride containing the structure of Chemical Formula 2 may be contained in an amount of 10 mol % to 40 mol %, based on the total amount of the tetracarboxylic dianhydride.

According to one embodiment, the compound of Chemical Formula 2 may be selected from compounds of the following Chemical Formulas 2a to 2e.

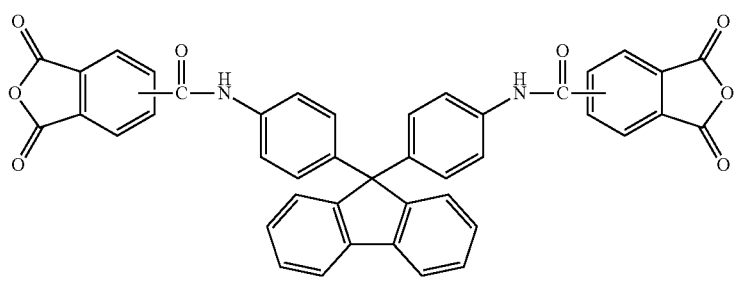
(2a)

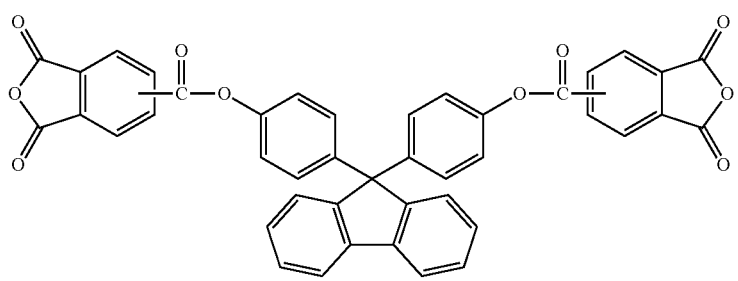
(2b)

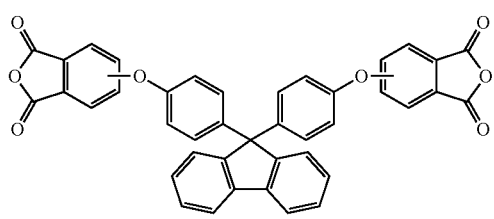
(2c)

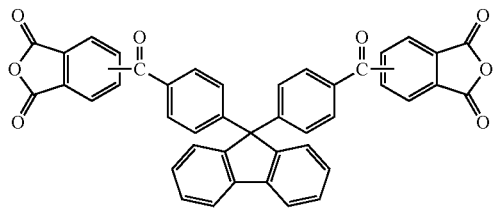
(2d)

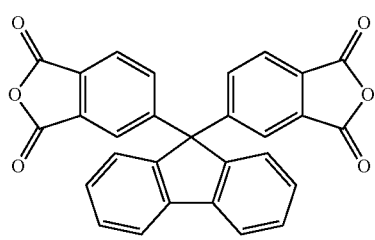
(2e)

According to one embodiment, the viscosity of the polyimide precursor solution may be 2,000 cp to 8,000 cp.

According to one embodiment, the organic solvent may have Log P as a positive value, and the organic solvent having Log P as a positive value may be selected from N,N-diethylacetamide, (DEAc), N,N-diethylformamide (DEF), N-ethylpyrrolidone (NEP) or a mixture thereof.

According to one embodiment, the precursor solution may further comprises a diamine monomer of the following Chemical Formula 5, a concentration of an imide group of a polyimide resin manufactured from the polyimide precursor may be 2.00 mmol/g to 3.70 mmol/g, and the polyimide resin manufactured from the polyimide precursor solution may have at least one glass transition temperature at 150° C. to 380° C., and at least one glass transition temperature in a temperature range of lower than 0° C.:

[Chemical Formula 5]

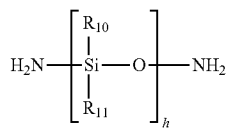

wherein, $R_{10}$ and $R_{11}$ are each independently C1-20 organic group; and h is an integer of 3 to 200.

In order to solve another object of the present invention, the present invention provides a polyimide film manufactured from the polyimide precursor solution.

According to one embodiment, the polyimide film may have a thickness retardation ($R_{th}$) of 0 nm to 1500 nm.

According to one embodiment, the polyimide film may have a positive coefficient of thermal expansion (CTE) when cooling the polyimide film after heating thereof.

According to one embodiment, the polyimide film may show a coefficient of thermal expansion (CTE) of 0 ppm/° C. to 25 ppm/° C. after heating and then cooling the polyimide film n+1 times (n is an integer equal to or greater than 0) in the range of from 100° C. to 450° C.

According to one embodiment, the polyimide film may have a haze of 2 or less.

Further, the present invention provides a method for manufacturing a polyimide film comprising the following steps of:

spreading and coating the polyimide precursor solution on a substrate; and heat-treating the polyimide precursor solution coated on the substrate at a temperature of 320° C. or higher.

According to one embodiment, the polyimide film may contain a solid content of 8 to 18 wt % based on the polyimide precursor solution.

Further, the present invention provides a transparent polyimide substrate for Oxide TFT or LTPS manufactured by using the polyimide precursor solution.

Advantageous Effects

The present invention provides a polyimide film with excellent heat resistance and optical properties at the same time by introducing a fluorene structure into a rigid polyimide chain. Further, the polyimide according to the present invention containing a specific structure can be used in various fields such as a substrate for a device, a cover substrate for a display, an optical film, an Integrated circuit (IC) package, an adhesive film, a multi-layer flexible printed circuit (FPC), a tape, a touch panel and a protection film for an optical disk due to its excellent transparency, heat resistance, mechanical strength and flexibility.

BEST MODE CARRYING OUT THE INVENTION

Various changes in form and details may be made to the presently disclosed embodiment and thus should not be construed as being limited to the aspects set forth herein. The presently disclosed embodiment is not limited to the aspects described in the present description, and thus it should be understood that the presently disclosed embodiment does not include every kind of variation example or alternative equivalent included in the spirit and scope of the presently disclosed embodiment. Also, while describing the aspects, detailed descriptions about related well-known functions or configurations that may diminish the clarity of the points of the aspects of the presently disclosed embodiment will be omitted.

Unless particularly stated otherwise herein, all the compounds or organic groups may be substituted or unsubstituted. Herein, the term 'substituted' means that at least one hydrogen atom in such a compound or substituent has been replaced by any one substituent selected from the group consisting of a halogen atom, a $C_{1-10}$ alkyl group, a halogenated alkyl group, a $C_{3-30}$ cycloalkyl group, a $C_{6-30}$ aryl group, a hydroxyl group, a $C_{1-10}$ alkoxyl group, a carboxyl group, an aldehyde group, an epoxy group, a cyano group, a nitro group, an amino group, a sulfonic acid group and derivatives thereof.

Further, unless particularly stated otherwise herein, the term 'combination thereof' means that two or more functional groups are bonded by a single bond, a double bond, a triple bond or a linking group such as a $C_{1-10}$ alkylene group (e.g., methylene group (—$CH_2$), ethylene group (—$CH_2CH_2$—), etc.), a $C_{1-10}$ fluoroalkylene group (e.g., fluoromethylene group (—$CF_2$—), a perfluoroethylene group (—$CF_2CF_2$—), etc.), a hetero atom such as N, O, P, S or Si, or a functional group containing thereof (e.g., intramolecular carbonyl group (—C=O—), ether group (—O—), ester group (—COO—), heteroalkylene group containing —S—, —NH—, —N=N—, etc.), or two or more functional groups are connected by condensation.

Flexible devices with a high temperature process require heat resistance at high temperature, and particularly, in the case of an organic light emitting diode (OLED) device using Oxide TFT and low temperature polycrystalline silicon (LTPS) processes, the process temperature sometimes comes to 350° C. or higher, close to 500° C.

At this temperature, even polyimide with excellent heat resistance is easily pyrolyzed, and may be shrunk or expanded by heat. Accordingly, in order to manufacture flexible devices, it is needed to develop polyimide which can exhibit excellent thermal stability while maintaining high transparency at high temperature, together with enough mechanical properties.

One object of the present invention is to provide a polyimide precursor solution which can manufacture a low retardation polyimide film having excellent optical properties, in particular, low thickness retardation as well as ultra-high heat resistance at the same time.

Another object of the present invention is to provide a polyimide film manufactured by using the polyimide precursor solution and a method for manufacturing the same.

The polyimide precursor solution of the present invention comprises a polyimide precursor manufactured by reacting polymerization ingredients, which comprises:
tetracarboxylic dianhydrides of the following Chemical Formula 1 and Chemical Formula 2; and
a diamine of the following Chemical Formula 3,
in an organic solvent:

[Chemical Formula 1]

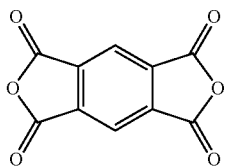

[Chemical Formula 2]

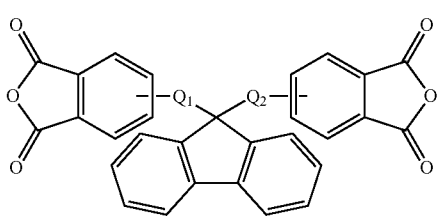

wherein,
$Q_1$ and $Q_2$ are each independently selected from the group consisting of a single bond, —O—, —C(=O)—, —C(=O)O—, —C(=O)NH—, —S—, —SO$_2$—, a phenylene group and a combination thereof;

[Chemical Formula 3]

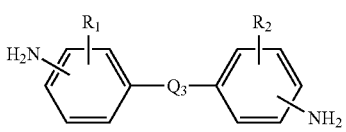

wherein,
$R_1$ and $R_2$ is each independently a substituent selected from a halogen atom selected from the group consisting of —F, —Cl, —Br and —I, a hydroxyl group (—OH), a thiol group (—SH), a nitro group (—NO$_2$), a cyano group, a $C_{1-10}$ alkyl group, a $C_{1-4}$ halogenoalkoxyl group, a $C_{1-10}$ halogenoalkyl group, and a $C_{6-20}$ aryl group, and preferably, it may be a substituent selected from a halogen atom, a halogenoalkyl, an alkyl group, an aryl group and a cyano group. For example, the halogen atom may be fluorine (—F), the halogenoalkyl may be a $C_{1-10}$ fluoroalkyl containing a fluorine atom selected from a fluoromethyl group, a perfluoroethyl group, a trifluoromethyl group and the like, the alkyl group may be selected from a methyl group, an ethyl group, a propyl group, an isopropyl group, a t-butyl group, a pentyl group and a hexyl group, and the aryl group may be selected from a phenyl group and a naphthalenyl group. More preferably, the substituent may be a fluoro-based substituent comprising fluorine atom, a fluoroalkyl group containing a fluorine atom, etc.

$Q_3$ is selected from the group consisting of a single bond, —O—, —CR$_{18}$R$_{19}$—, —C(=O)—, —C(=O)O—, —C(=O)NH—, a phenylene group and a combination thereof, wherein $R_{18}$ and $R_{19}$ are each independently selected from the group consisting of a hydrogen atom, a $C_{1-10}$ alkyl group and a $C_{1-10}$ fluoroalkyl group.

Herein, the term 'fluoro-based substituent' means not only 'fluorine atom' but also 'a substituent containing a fluorine atom'.

Further, based on the total amount of the tetracarboxylic dianhydride, an amount of the tetracarboxylic dianhydride containing the fluorene structure may be 10 mol % to 30 mol %, preferably 10 mol % to 25 mol %, more preferably 15 mol % to 25 mol %. By using the compound containing the fluorene structure together with the compound represented by Chemical Formula 1 to manufacture of polyimide, planar-direction shrinkage characteristic by heat is moderated, thereby improving film shrinkage occurred during a cooling process after a heating process. Therefore, heat resistance may be enhanced, for example, the CTE value at a cooling process after a heating process may be positive.

According to one embodiment of the present invention, a molar ratio of the total amount of the tetracarboxylic dianhydride and the amount of the diamine may be 1:0.99 to 0.99:1, preferably 1:0.98 to 0.98:1.

According to one embodiment, the compound of Chemical Formula 2 may be selected from compounds of the following Chemical Formulas 2a to 2e.

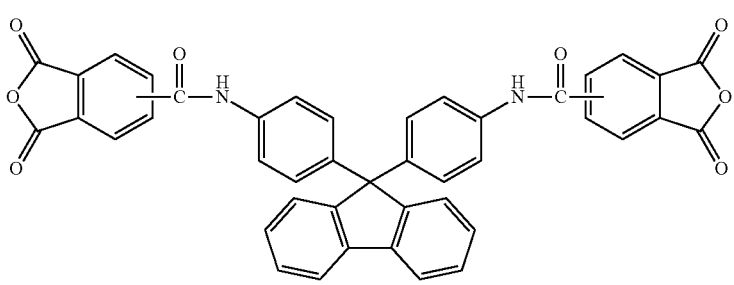

(2a)

-continued (2b)

(2c)

(2d)

(2e)

According to one embodiment, the compound of Chemical Formula 3 may be selected from compounds represented by the following Chemical Formulas 3a to 3d.

(3a)

(3b)

(3c)

(3d)

wherein, $Q_3$ has the same meaning as mentioned above.

According to one embodiment, the polymerization ingredients may further comprise a diamine monomer of Chemical Formula 5, and a concentration of an imide group of a polyimide resin manufactured from the polyimide precursor may be 2.00 mmol/g to 3.70 mmol/g:

[Chemical Formula 5]

wherein,
$R_{10}$ and $R_{11}$ are each independently C1-20 organic group; and
h is an integer of 3 to 200.

Further, according to one embodiment, the polyimide resin manufactured from the polyimide precursor solution may have at least one glass transition temperature at 150° C. to 380° C., and at least one glass transition temperature in a temperature range of lower than 0° C.

The glass transition temperature at 150° C. to 380° C. (hereinafter, Tg1) is measured as follows. A polyimide tape is subjected to thermomechanical analysis using a thermomechanical analyzer (TMA-50, manufactured by Shimadzu) under the conditions of a load of 5 g, a heating rate of 10° C./min and a nitrogen atmosphere (flow rate of 20 ml/min), elongation of a specimen is measured in a temperature range from 50° C. to 450° C., and then a inflection point of a curve is regarded as a glass transition temperature. The glass transition temperature in a temperature range of lower than a room temperature, i.e., lower than 0° C. (hereinafter, Tg2)

is measured as follows. A polyimide tape is subjected to a dynamic rheometer (RHEOVIBRON MODEL RHEO-1021, manufactured by Orientec) in a range of −150° C. to 400° C., an inflection point in a temperature region of lower than a room temperature of E prime is measured, and the inflection point is regarded as a glass transition temperature at a low temperature.

A polyimide film which is obtained by spreading the polyimide precursor solution on the surface of a support followed by heating the polyimide precursor solution under a nitrogen atmosphere at 320° C. to 500° C. may have a residual stress of 25 MPa or less in a film thickness of 10 μm.

The polyimide according to the present invention may contain repeating structures represented by the following Chemical Formula 4a and Chemical Formula 4b together, or repeating structures represented by the following Chemical Formula 4a and Chemical Formula 4c together:

polyamic acid containing high solid content can be obtained, and by polymerizing the polyimide structures having thermal expansion characteristics in a proper ratio, the heat resistance of the film in the heating and cooling process can be optimized. Further, by introducing the repeating structure containing the fluorine structure into polyimide, the thickness retardation of the film may be reduced.

The reaction of the tetracarboxylic dianhydride with the diamine may be performed according to the conventional polyimide precursor polymerization method such as solution polymerization. Specifically, the polyimide precursor can be manufactured by dissolving the diamine in an organic solvent, adding the tetracarboxylic dianhydride and dicarboxylic acid or dicarboxyl chloride to the mixed solution thus obtained and then polymerizing thereof.

[Chemical Formula 4a]

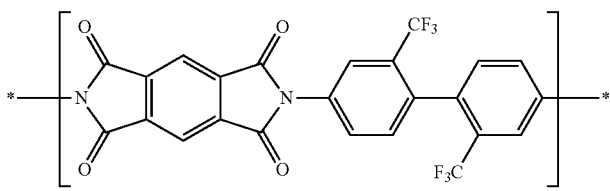

[Chemical Formula 4b]

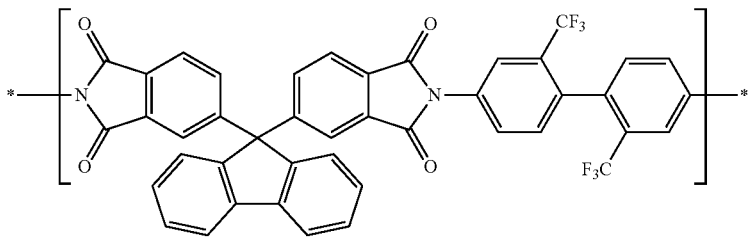

[Chemical Formula 4c]

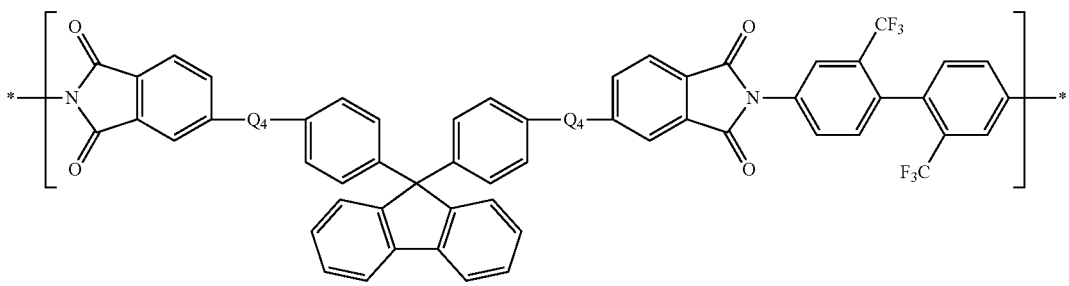

wherein, $Q_4$ is each independently selected from the group consisting of a single bond, —O—, —C(=O)—, —C(=O)O—, —C(=O)NH—, —S—, —SO$_2$—, a phenylene group and a combination thereof.

In the repeating structures of Chemical Formula 4a and Chemical Formula 4b or Chemical Formula 4c, based on the amount of the entire repeating structures, an amount of the repeating structure of Chemical Formula 4b or Chemical Formula 4c may be 10 mol % to 40 mol %, preferably 10 mol % to 30 mol %, more preferably 15 mol % to 25 mol %. The structure of Chemical Formula 4a is a polyimide structure which shows severe thermal shrinkage behavior by cooling during heating and cooling processes. By introducing the polyimide repeating structure containing the fluorene structure of Chemical Formula 4b or 4c, low viscosity The reaction can be performed under inert gas or nitrogen atmosphere, and also can be performed in an anhydrous condition.

Further, the polymerization reaction can be performed at a temperature of −20° C. to 60° C., preferably 0° C. to 45° C. If the reaction temperature is too high, molecular weight may be increased due to increased reactivity, and the viscosity of the precursor composition may be increased. Thus, it may be disadvantageous in the process.

Further, the organic solvent, which can be used in the polymerization reaction, may be a solvent having a positive partition coefficient (Log P value) at 25° C. and a boiling point of 180° C. or lower. More specifically, the solvent may have a partition coefficient (Log P value) of 0.01 to 3, 0.01 to 2, or 0.01 to 1.

The partition coefficient may be calculated by using an ACD/Log P module of ACD/Percepta platform (ACD/

Labs), and the ACD/Log P module uses algorithm based on Quantitative Structure-Property Relationship (QSPR) methodology which uses a 2D structure of a molecule.

The positive value of the partition coefficient means the polarity of the solvent is hydrophobic. According to the study of the present inventors, it can be found that the dewetting characteristic of the solution may be improved by manufacturing a polyimide precursor solution using a specific solvent with the positive partition coefficient value. Further, the present invention can control the dewetting phenomenon of the solution by using a solvent having the positive Log P value, without using additives such as a leveling agent, which adjusts the surface tension of a material and the smoothness of a film. Because of not using additional additives, the present invention has effect of removing the problems on quality and process, for example, a problem that a low molecular weight material is contained in the final product, and forming a polyimide film with uniform characteristic more efficiently.

For example, in the process of coating the polyimide precursor solution on a glass substrate, dewetting phenomenon may be caused due to shrinkage of the coated layer when curing or storing the coating solution under a humidity condition. This dewetting phenomenon of the coating solution may cause variation in thickness of a film, and therefore, due to lack of flexibility of the film, the film may be cut or edges may be broken when cutting, resulting in poor working performance and reduced yield.

Further, when fine polar foreign materials are introduced into the polyimide precursor solution coated on a substrate, in the polyimide precursor solution containing a polar solvent having a negative Log P value, sporadic cracks and thickness change of the coating may be formed based on the position of the foreign material due to the polarity of the foreign material. But in the case of using a hydrophobic solvent having a positive Log P value, the change of the thickness caused by the cracks of the coating may be reduced or inhibited even in that case that the fine polar foreign materials are introduced.

Specifically, the polyimide precursor solution comprising the solvent having a positive Log P may have a dewetting rate of 0% to 0.1% as defined by the following Formula 1:

Dewetting rate (%)=[(A−B)/A]×100     [Formula 1]

wherein,

A: The area of the polyimide precursor solution in the state that the polyimide precursor solution was completely coated on the substrate (100 mm×100 mm);

B: The area of the polyimide precursor solution or the polyimide (PI) film after the polyimide precursor solution or the polyimide film is dewetted from the end of the coated substrate.

Such dewetting phenomenon of the polyimide precursor solution and the film may occur within 30 min after coating the polyimide precursor solution, and particularly, because the dewetting is started from the edge, the thickness of the edge may increase.

After coating the polyimide precursor solution according to the present invention on a substrate and then storing thereof for 10 min or longer, for example, 10 min or longer, for example, 40 min or longer under a humidity condition, the dewetting rate of the coated polyimide precursor solution may be 0.1% or less. For example, even after storing at a temperature of 20° C. to 30° C. and under a humidity condition of 40% or more, more specifically, under a humidity condition of a range from 40% to 80%, i.e., 40%, 50%, 60%, 70% and 80%, respectively, for example, 50%, for 10 min to 50, the dewetting rate may be very low as 0.1% or less, preferably 0.05%, more preferably near 0%.

Such dewetting rate is also maintained after curing. For example, after coating the polyimide precursor solution on a substrate, storing thereof for 10 min or longer, for example, at a temperature of 20° C. to 30° C. and under a humidity condition of 40% or more, more specifically, under a humidity condition of a range from 40% to 80%, i.e., 40%, 50%, 60%, 70% and 80%, respectively, for example, storing under a humidity condition of 50% for 10 min to 50 min and then curing thereof at 320° C. or higher, the dewetting rate of the polyimide film thus obtained may be 0.1% or less. In other word, there may be little or no dewetting in the curing process by heat-treatment, and specifically, the dewetting rate may be 0.05%, more preferably near 0%.

The polyimide precursor solution according to the present invention can solve this dewetting phenomenon, thus more improving the yield of a manufacturing process by obtaining a polyimide with more uniform characteristics Further, the density of the solvent according to the present invention may be measured by a standard measuring method of ASTM D1475, and it may be 1 g/cm$^3$ or less. If the density is more than 1 g/cm$^3$, the relative viscosity may be increased and therefore the process efficiency may be reduced.

The solvent which can be used in the present invention may be selected from N,N-diethylacetamide (DEAc), N,N-diethylformamide (DEF), N-ethylpyrrolidone (NEP) or a mixture thereof.

The polyimide precursor solution manufactured by the manufacturing method mentioned above may contain the solid in such an amount that the solution has an appropriate viscosity considering its film formation processability such as coatability. According to one embodiment, the content of the solution may be controlled to have the total content of the polymer of 5 to 20 wt %, preferably 8 to 18 wt %, more preferably 8 to 12 wt %.

Or the content of the solution may be controlled such that the polyimide precursor solution has viscosity of 2,000 cP or higher or 3,000 cP or higher, and the viscosity of the polyimide precursor solution may be controlled to 10,000 cP or less, preferably 9,000 cP or less, more preferably 8,000 cP or less. If the viscosity of the polyimide precursor solution is more than 10,000 cP, the process efficiency may be deteriorated due to reduced defoamation efficiency when processing the polyimide film, and also electrical, optical and mechanical properties of the film may be deteriorated due to bad surface profile caused by bubble formation.

Further, the polyimide according to the present invention may have a weight average molecular weight of 10,000 to 200,000 g/mol, 20,000 to 100,000 g/mol or 30,000 to 100,000 g/mol. Further, the polyimide according to the present invention may have a molecular weight distribution (Mw/Mn) of 1.1 to 2.5, preferably. If the weight average molecular weight or molecular weight distribution of the polyamide-imide is out of the range defined above, there may be a difficulty in forming the film or there is a risk that the characteristics of the polyimide-based film such as transmittance, heat resistance and mechanical properties may be deteriorated.

Then, a transparent polyimide film can be manufactured by imidizing the polyimide precursor thus obtained from the above polymerization reaction. At this time, specifically, the imidization process may be performed by a chemical imidization method or a thermal imidization method.

For example, the polyimide can be obtained by a imidization method using chemical reaction in which a dehydrating agent and an imidization catalyst is added to the polymerized polyimide precursor solution and then the resulting solution is heated at a temperature of 50° C. to 100° C., or by a imidization method in which alcohol is removed while refluxing the above solution.

In the chemical imidization method, the imidization catalyst may be pyridine, triethylamine, picoline or quinoline and the like, and in addition, it may be substituted or unsubstituted nitrogen-containing heterocyclic compounds, N-oxide compounds of a nitrogen-containing heterocyclic compound, substituted or unsubstituted amino acid compounds, aromatic hydrocarbon compounds having a hydroxyl group or aromatic heterocyclic compounds. In particular, the catalyst may be imidazole derivatives such as lower alkylimidazoles, for example, 1,2-dimethylimidazole, N-methylimidazole, N-benzyl-2-methylimidazole, 2-methylimidazole, 2-ethyl-4-methylimidazole, 5-methylbenzimidazole and the like; substituted pyridines, for example, isoquinoline, 3,5-dimethylpyridine, 3,4-dimethylpyridine, 2,5-dimethylpyridine, 2,4-dimethylpyridine, 4-n-propylpyridine and the like; p-toluene sulfonic acid and the like.

The dehydrating agent may be an acid anhydride such as acetic acid anhydride.

Alternatively, the imidization may be performed by coating the polyimide precursor solution on a substrate and then heat-treating thereof.

The polyimide precursor solution may be in the form of a solution dissolved in an organic solvent, and in this case, for example, when the polyimide precursor is synthesized in the organic solvent, the solution may be the reaction solution thus obtained itself or a solution obtained by diluting the reaction solution with another solvent. Further, when the polyimide precursor is obtained as solid powder, the solution may be a solution obtained by dissolving the powder in an organic solvent.

The present invention provides a method for manufacturing a polyimide film comprising the following steps of:

coating the polyimide precursor solution on a substrate; and heat-treating the polyimide precursor solution coated on the substrate.

After coating the polyimide precursor solution on a substrate, the solution can be heat-treated in an IR oven or a hot air oven, or on a hot plate, and the heat-treatment for curing may be performed at a temperature ranging from 300° C. to 500° C., preferably 320° C. to 480° C., and also may be performed by multi-step heating within the above temperature range. The heat-treating process may be performed for 20 min to 70 min, preferably 20 min to 60 min.

The organic solvent contained in the polyimide precursor solution of the present invention may be the same organic solvent used for the above synthesis reaction.

In a range that does not have an influence upon the effect of the present invention a coupling agent, a crosslinkable compound, an imidization catalyst for effectively proceeding imidization and the like can be added.

Further, the haze of the polyimide film according to the present invention may be 1 or less, and a polyimide film with improved transparency, which has the haze value of preferably 0.9 or less, or 0.7 or less, more preferably 0.5 or less, can be provided. At this time, the thickness of the polyimide film may be 8 μm to 15 μm, preferably 10 μm to 12 μm.

Further, the polyimide-based film may be a colorless and transparent polyimide film having a transmittance of at least 80% to light at a wavelength of 380 nm to 760 nm within the film thickness of 5 μm to 30 μm, and a yellowness index (YI) of about 25 or less, preferably about 20 or less or about 5 or less, more preferably about 16 or less, or 15 or less. The film can exhibit markedly improved transparency and optical properties due to its excellent light transmittance and yellowness index.

Further, the polyimide-based film may have an in-plane retardation ($R_{in}$) of about 0 to about 100 nm and a thickness retardation ($R_{th}$) of about 1500 nm or less, or 0 nm to 1000 nm, preferably 30 nm to 800 nm, more preferably 50 nm to 700 nm. It is possible to develop a visual sensitivity suitable for a display in the thickness retardation range, and if the thickness retardation is 1500 nm or more, a retardation is generated in a polyimide film, and as light looks distorted, the visual sensitivity may be significantly deteriorated.

Further, the polyimide film according to the present invention may have excellent heat resistance according to temperature change. For example, the polyimide film according to the present invention may have the coefficient of thermal expansion (CTE) of −10 ppm/° C. to 25 ppm/° C., more preferably −7 ppm/° C. to 20 ppm/° C., or 0 ppm/° C. to 20 ppm/° C., after heating and then cooling the polyimide film n+1 times (n is an integer equal to or greater than 0) in a range from 100° C. to 450° C.

Thus, in another embodiment of the present invention, an article comprising the polyimide copolymer is provided.

The article maybe a film, a fiber, a coating material, an adhesive and the like, but not limited thereto. The article may be formed by a dry/wet method, a dry method, a wet method and the like using a composite composition of the copolymer and inorganic particles, but not limited thereto. Specifically, as described above, the article may be an optical film, and in this case, the composition comprising the polyimide copolymer may be easily manufactured by being applied on a substrate through a spin coating method followed by being dried and cured.

The polyimide according to the present invention can maintain characteristics such as heat resistance, mechanical strength and the like due to its rigid structure, in particular, excellent heat resistance against thermal shrinkage behavior which can occur during a high temperature process, and also exhibit excellent colorless and transparent characteristics. Thus, it can be used in various fields such as a substrate for a device, a cover substrate for a display, an optical film, an integrated circuit (IC) package, an adhesive film, a multi-layer flexible printed circuit (FPC), a tape, a touch panel, a protection film for an optical disk and the like.

According to another embodiment of the present invention, a display device comprising the article is provided. Specifically, the display device may be a liquid crystal display device (LCD), an organic light emitting diode (OLED) and the like. In particular, the polyimide may be suitable for an OLED device which uses a LTPS (low temperature polycrystalline silicon) process requiring a high temperature process, but not limited thereto.

MODE FOR INVENTION

The present invention will be explained in detail with reference to the following examples, including test examples. However, these examples are provided for illustrative purposes only and are not intended to limit the scope of the invention.

EXAMPLE

<Example 1>
TFMB(0.999)/PMDA(0.9)_BPFA(0.1)

N,N-diethylacetamide (DEAc, partition coefficient: 0.32, density: 0.9130 g/cm$^3$) 80 g was filled in a reactor under nitrogen atmosphere, and then 2,2'-bis(trifluoromethyl)-4,4'-biphenyl diamine (TFMB) 11.4 g was dissolved while maintaining the temperature of the reactor to 25° C. Pyromellitic Dianhydride (PMDA) 7 g and 9,9'-bis(3,4-dicaroxyphenyl)fluorene dianhydride (BPFA) 1.63 g were added to the TFMB solution at the same temperature, and dissolved with stirring for a predetermined period of time. DEAc was added to the polyimide precursor solution prepared from the above reaction to make the solid concentration of 10 wt % to 15 wt %. Viscosity of the polyimide precursor solution thus obtained was 5,300 cp.

<Example 2>
TFMB(0.999)/PMDA(0.85)_BPFA(0.15)

N,N-diethylacetamide (DEAc, partition coefficient: 0.32, density: 0.9130 g/cm$^3$) 86 g was filled in a reactor under nitrogen atmosphere, and then 2,2'-bis(trifluoromethyl)-4,4'-biphenyl diamine (TFMB) 12.0 g was dissolved while maintaining the temperature of the reactor to 25° C. Pyromellitic Dianhydride (PMDA) 7 g and 9,9'-bis(3,4-dicaroxyphenyl)fluorene dianhydride (BPFA) 2.59 g were added to the TFMB solution at the same temperature, and dissolved with stirring for a predetermined period of time. DEAc was added to the polyimide precursor solution prepared from the above reaction to make the solid concentration of 10 wt % to 15 wt %. Viscosity of the polyimide precursor solution thus obtained was 4,800 cp.

<Example 3>
TFMB(0.999)/PMDA(0.8)_BPFA(0.20)

N,N-diethylacetamide (DEAc, partition coefficient: 0.32, density: 0.9130 g/cm$^3$) 94 g was filled in a reactor under nitrogen atmosphere, and then 2,2'-bis(trifluoromethyl)-4,4'-biphenyl diamine (TFMB) 12.0 g was dissolved while maintaining the temperature of the reactor to 25° C. Pyromellitic Dianhydride (PMDA) 7 g and 9,9'-bis(3,4-dicaroxyphenyl)fluorene dianhydride (BPFA) 2.59 g were added to the TFMB solution at the same temperature, and dissolved with stirring for a predetermined period of time. DEAc was added to the polyimide precursor solution prepared from the above reaction to make the solid concentration of 10 wt % to 15 wt %. Viscosity of the polyimide precursor solution thus obtained was 4,100 cp.

<Comparative Example 1>
TFMB(0.99)/PMDA(1.0)

N,N-diethylacetamide (DEAc, partition coefficient: 0.32, density: 0.9130 g/cm$^3$) 100 g was filled in a reactor under nitrogen atmosphere, and then 2,2'-bis(trifluoromethyl)-4,4'-biphenyl diamine (TFMB) 10.17 g was dissolved while maintaining the temperature of the reactor to 25° C. Pyromellitic Dianhydride (PMDA) 7 g was added to the TFMB solution at the same temperature, and dissolved with stirring for a predetermined period of time. DEAc was added to the polyimide precursor solution prepared from the above reaction to make the solid concentration of 10 wt % to 10.5 wt %. Viscosity of the polyimide precursor solution thus obtained was 9,500 cp.

<Comparative Example 2> TFMB(0.99)/BPFA(1.0)

N,N-diethylacetamide (DEAc, partition coefficient: 0.32, density: 0.9130 g/cm$^3$) 135 g was filled in a reactor under nitrogen atmosphere, and then 2,2'-bis(trifluoromethyl)-4,4'-biphenyl diamine (TFMB) 13.9 g was dissolved while maintaining the temperature of the reactor to 25° C. 9,9'-bis(3,4-dicaroxyphenyl)fluorene dianhydride (BPFA) 20 g was added to the TFMB solution at the same temperature, and dissolved with stirring for a predetermined period of time. DEAc was added to the polyimide precursor solution prepared from the above reaction to make the solid concentration of 10 wt % to 15 wt %. Viscosity of the polyimide precursor solution thus obtained was 3,800 cp.

Test Example 1

Each of the polyimide precursor solutions manufactured in Examples 1 to 3 and Comparative Examples 1 and 2 was spin coated on a glass substrate to a thickness of 9.5 μm to 11 μm. The polyimide precursor solution-coated glass substrate was put in an oven and heated at a rate of 2° C./min, and heat-treated at 0° C. for 15 min, at 150° C. for 30 min, at 220° C. for 30 min and at 380° C. for 1 hour to perform a curing process. After the curing process is completed, the glass substrate was immersed in water. The film formed on the glass substrate was peeled off and dried in an oven at 100° C. to manufacture a polyimide film.

Haze characteristic and CTE of the film was measured by the following method and the results were shown in Table 1.

Haze was measured by the method according to ASTM D1003 using Haze Meter HM-150.

The films were prepared in the size of 5 mm×20 mm, and a sample was loaded thereon using an accessory. The actual measured length of the films was same as 16 mm, and the force pulling the film was set to 0.02 N. The thermal expansion change pattern, when the 1$^{st}$ heating process was performed within the temperature ranging from 100° C. to 400° C. at a heating rate of 5° C./min and then the cooling process is performed within the temperature ranging from 400° C. to 100° C. at a cooling rate of 4° C./min, was measured with TMA (Q400, TA Instruments).

TABLE 1

| Analysis item | Comparative Example 1 | Comparative Example 2 | Example 1 | Example 2 | Example 3 |
|---|---|---|---|---|---|
| Solid content (%) | 10.0 | 15 | 13.2 | 14.6 | 13.5 |
| Mw | 89,000 | 65,000 | 68,000 | 67,000 | 62,000 |
| Viscosity(cp) | 9,500 | 3,800 | 5,300 | 4,800 | 4,100 |
| Thickness (μm) | 9.5 | 9.9 | 10.0 | 10.1 | 10.2 |
| CTE 1$^{st}$ 100~400° C. cooling (ppm/° C.) | −21 | 80 | −5.57 | 12.1 | 19.9 |
| Tg(° C.) | N.D. | 390 | N.D. | N.D. | N.D. |
| Td 1%(° C.) | 538 | 547 | 544.6 | 544.3 | 541.7 |
| Transmittance 450 nm | 70 | 82.1 | 77.2 | 77.6 | 78.8 |

TABLE 1-continued

| Analysis item | Comparative Example 1 | Comparative Example 2 | Example 1 | Example 2 | Example 3 |
|---|---|---|---|---|---|
| % 550 nm | 86 | 89.9 | 88.0 | 88.1 | 88.3 |
| Yellowness index | 25 | 3.5 | 13.7 | 13.3 | 12.1 |
| Rth | 1800 | 30 | 1000 | 850 | 660 |
| Haze | 0.45 | 0.35 | 0.41 | 0.4 | 0.34 |
| Modulus (Gpa) | 7.7 | 7.0 | 7.7 | 7.1 | 6.5 |
| Peel strength (gf/inch) | 120 | 180 | 148 | 160 | 175 |

According to the results of Table 1, the polyimide precursor solutions of Example 1 to Example 3 according to the present invention can realize low viscosity at high solid content without changing a molar ratio. Accordingly, the solutions can be more uniformly coated during film processing, time for defoaming the solutions can be reduced, and defoaming efficiency can be more enhanced. Further, the films manufactured from the polyimide precursor solutions of Examples 1 to 3 showed CTE value of very small negative value or a positive value range, and it means that the shrinkage characteristic of the film during a heating and cooling processes was significantly reduced compared to Comparative Example 1. The film of Comparative Example 1 showed big negative CTE value, and it means that the film was severely shrunk. The film of Comparative Example 2 only comprising BPFA as a dianhydride showed very big positive CTE value, and it means that the film was severely expanded by cooling.

The CTE value of the polyimide precursor solution according to the present invention can be controlled in a certain range by optimizing the contents of BPFA and PMDA, and therefore, a film with improved thermal expansion and shrinkage characteristics can be provided.

Further, in the present invention, the thickness retardation of the film and distortion of light are significantly reduced by containing the repeating structure, which contains a fluorene structure like BPFA, in the polyimide structure, thereby enhancing visual sensitivity.

<Example 4>
TFMB(0.954)/PMDA(0.7)_BPFA(0.3)+X22-1660B-3

While inserting nitrogen gas into a 3 L separable flask equipped with an oil bath and a stirring rod, a both terminal amine modified methylphenyl silicone oil (manufactured by Shin-etsu chemical: X22-1660B-3 (Number average molecular weight: 4400)) 8.0 g and DEAc were added thereto, and continuously BPFA 45.0 g was added thereto followed by stirring for 30 min. Then, after adding TFMB 100 g thereto and complete dissolution of the TFMB was confirmed. PMDA 50 g was added thereto, stirred for 3 hours at a room temperature, heated to 80° C. and then stirred for 4 hours. After removing the oil bath, the temperature was cooled to a room temperature to obtain a polyimide precursor solution. Weight average molecular weight (Mw) of the polyimide precursor and the test results of the film cured at 350° C. were shown in the following Table 2.

Test Example 2

<Evaluation of Glass Transition Temperature>
For measuring glass transition temperature at a temperature higher than room temperature range (hereinafter, Tg1), the polyimide film was subjected to thermomechanical analysis using a thermomechanical analyzer (TMA-50, manufactured by Shimadzu) under the conditions of a load of 5 g, a heating rate of 10° C./min and a nitrogen atmosphere (flow rate of 20 ml/min), elongation of a specimen was measured in a temperature range from 50° C. to 450° C., and then a inflection point of a curve was regarded as a glass transition temperature.

For measuring glass transition temperature in a temperature range of lower than a room temperature (hereinafter, Tg2) which can't be measured by the above method, the polyimide film thus obtained was subjected to a dynamic rheometer (RHEOVIBRON MODEL RHEO-1021, manufactured by Orientec) in a range of −150° C. to 400° C., a inflection point in a temperature region of lower than a room temperature of E prime was measured, and the inflection point was regarded as a glass transition temperature at a low temperature.

<Evaluation of Tensile Elongation and Rupture Strength>
A polyimide film cured at 350° C. (sample size: 5×50 mm, thickness: 20 μm) was elongated using a tensile tester (manufactured by A and D company limited: RTG-1210) at a rate of 100 mm/min to measure tensile elongation and rupture strength.

<Evaluation of Residual Stress>
Polyamic acid was coated by a bar coater on a 6 inch silicon wafer (thickness: 625 μm±25 μm), whose 'bending quantity' was measured in advance using a residual strength measuring device (manufactured by Tencor, model name: FLX-2320) and then pre-baked. Then, heat curing was performed at 350° C. for 1 hour using a vertical cure furnace (manufactured by Koyo Lindbergh Co., Ltd, model name: VF-2000B) under nitrogen atmosphere to manufacture a silicon water on which a polyimide film in 10 μm thick was formed. Bending quantity of the wafer was measured by the above residual stress measuring device, and residual stress formed between the silicon water and the polyimide film was evaluated.

TABLE 2

| Analysis item | Tg1 (° C.) | Tg2 (° C.) | Residual stress (MPa) | Tensile elongation (%) | Break strength (MPa) |
|---|---|---|---|---|---|
| Example 4 | 350 | −60 | 17 | 50 | 300 |

Although specific embodiments of the present invention are described in detail as described above, it will be apparent to those skilled in the art that the specific description is merely desirable exemplary embodiment and should not be construed as limiting the scope of the present invention. Therefore, the substantial scope of the present invention is defined by the accompanying claims and equivalent thereof.

The invention claimed is:

1. A polyimide precursor solution which comprises a polyimide precursor consisting of a reaction product of tetracarboxylic dianhydrides of the following Chemical Formula 1 and Chemical Formula 2; and a diamine of the following Chemical Formula 3 in N,N-diethylacetamide, (DEAc), N,N-diethylformamide (DEF), N-ethylpyrrolidone (NEP), or a mixture thereof, wherein the tetracarboxylic dianhydride containing the structure of Chemical Formula 2 is contained in an amount of 10 mol % to 40 mol %, based on the total amount of the tetracarboxylic dianhydrides:

[Chemical Formula 1]

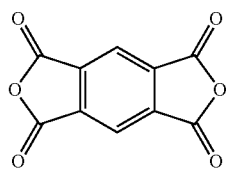

[Chemical Formula 2]

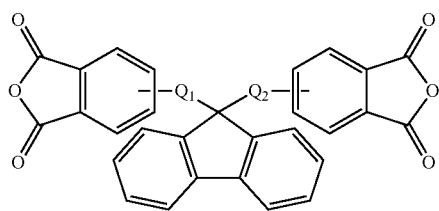

wherein,
$Q_1$ and $Q_2$ are each independently selected from the group consisting of a single bond, —O—, —C(=O)—, —C(=O)O—, —C(=O)NH—, —S—, —SO$_2$—, a phenylene group and a combination thereof;

[Chemical Formula 3]

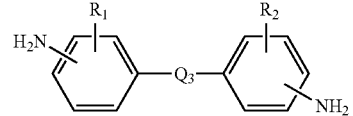

wherein,
$R_1$ and $R_2$ are each independently a substituent selected from a halogen atom selected from the consisting of —F, —Cl, —Br and —I, a hydroxyl group (—OH), a thiol group (—SH), a nitro group (—NO$_2$), a cyano group, a $C_{1-10}$ alkyl group, a $C_{1-4}$ halogenoalkoxyl group, a $C_{1-10}$ halogenoalkyl group, and a $C_{6-20}$ aryl group; and $Q_3$ is selected from the group consisting of a single bond, —O—, —CH$_{18}$R$_{19}$—, —C(=O)—, —C(=O)O—, —C(=O)NH—, —S—, —SO$_2$—, a phenylene group and a combination thereof, wherein $R_{18}$ and $R_{19}$ are each independently selected from the group consisting of a hydrogen atom, a $C_{1-10}$ alkyl group and a $C_{1-10}$ fluoroalkyl group.

2. The polyimide precursor solution according to claim 1, wherein the tetracarboxylic dianhydride having the structure of Chemical Formula 2 is contained in an amount of 10 mol % to 30 mol %, based on the total amount of the tetracarboxylic dianhydrides.

3. The polyimide precursor solution according to claim 1, wherein the structure of Chemical Formula 2 is selected from structures of the following Chemical Formulas 2a to 2e.

(2a)

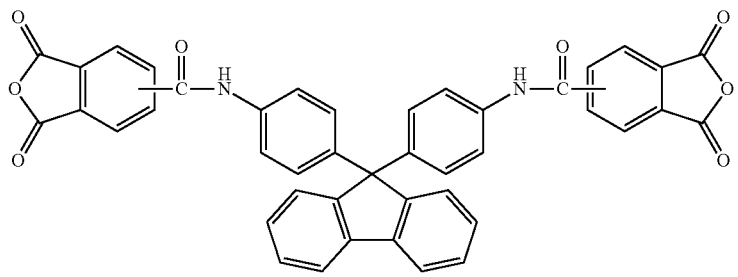

(2b)

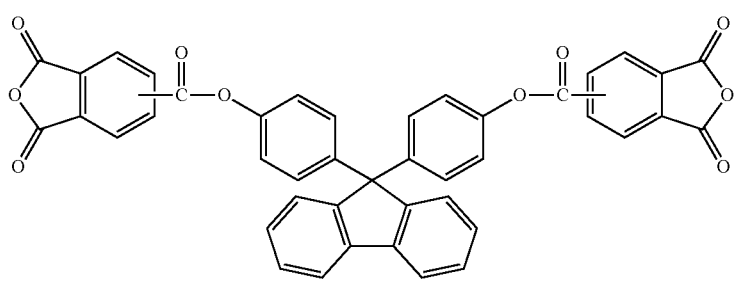

(2c)

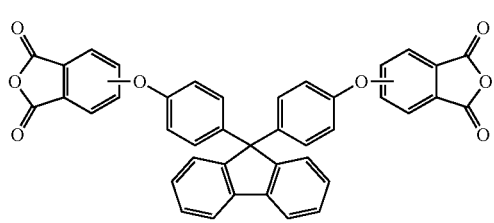

(2d)

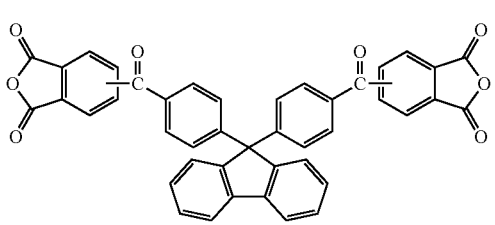

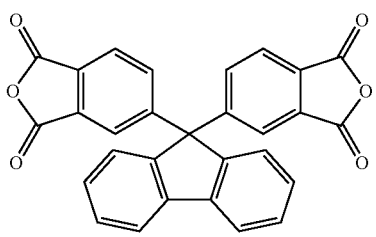

4. The polyimide precursor solution according to claim 1, wherein the viscosity of the polyimide precursor solution is 2,000 cp to 8,000 cp.

5. A polyimide precursor solution which comprises a polyimide precursor consisting of a reaction product of tetracarboxylic dianhydride containing 60 mol % to 90 mol % tetracarboxylic dianhydride of the following Chemical Formula 1 and 10 mol % to 40 mol % of tetracarboxylic dianhydride of the following Chemical Formula 2; and diamines of the following Chemical Formula 3 and the Chemical Formula 5; in an organic solvent, wherein a concentration of an imide group of a polyimide resin manufactured from the polyimide precursor is 2.00 mmol/g to 3.70 mmol/g:

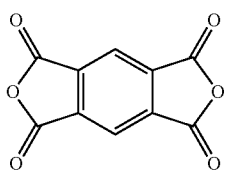

[Chemical Formula 1]

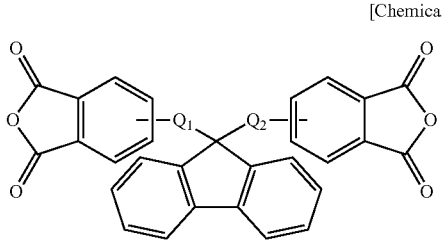

[Chemical Formula 2]

wherein, $Q_1$ and $Q_2$ are each independently selected from the group consisting of a single bond, —O—, —C(=O)—, —C(=O)O—, —C(=O)NH—, —S—, —SO$_2$—, a phenylene group and a combination thereof;

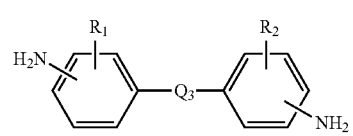

[Chemical Formula 3]

wherein, $R_1$ and $R_2$ are each independently a substituent selected from a halogen atom consisting of —F, —Cl, —Br and —I, a hydroxyl group (—OH), a thiol group (—SH), a nitro group (—NO$_2$), a cyano group, a $C_{1-10}$ alkyl group, a $C_{1-4}$ halogenoalkoxyl group, a $C_{1-10}$ halogenoalkyl group, and a $C_{6-20}$ aryl group; and $Q_3$ is selected from the group consisting of a single bond, —O—, —CR$_{18}$R$_{19}$—, —C(=O)—, —C(=O)O—, —C(=O)NH—, —S—, —SO$_2$—, a phenylene group and a combination thereof, wherein $R_{18}$ and $R_{19}$ are each independently selected from the group consisting of a hydrogen atom, a $C_{1-10}$ alkyl group and a $C_{1-10}$ fluoroalkyl group;

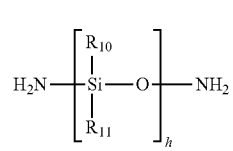

[Chemical Formula 5]

wherein, $R_{10}$ and $R_{11}$ are each independently C1-20 organic group; and h is an integer of 3 to 200.

6. The polyimide precursor solution according to claim 5, wherein the polyimide resin manufactured from the polyimide precursor solution has at least one glass transition temperature at 150° C. to 380° C., and at least one glass transition temperature in a temperature range of lower than 0° C.

* * * * *